United States Patent
Wybenga et al.

(10) Patent No.: US 7,673,215 B2
(45) Date of Patent: Mar. 2, 2010

(54) APPARATUS AND METHOD FOR USING AN ERROR CORRECTING CODE TO ACHIEVE DATA COMPRESSION IN A DATA COMMUNICATION NETWORK

(75) Inventors: Jack C. Wybenga, Plano, TX (US); Patricia Kay Sturm, Marion, IA (US); Pradeep Samudra, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 749 days.

(21) Appl. No.: 11/015,751

(22) Filed: Dec. 17, 2004
(Under 37 CFR 1.47)

(65) Prior Publication Data
US 2006/0294448 A1    Dec. 28, 2006

(51) Int. Cl.
*H03M 13/00* (2006.01)
(52) U.S. Cl. .................. 714/758; 714/746; 714/782; 714/800
(58) Field of Classification Search .................. 714/758, 714/746, 782, 800, 801, 805, 769; 704/503; 382/232; 341/107; 375/240.11
See application file for complete search history.

(56) References Cited

U.S. PATENT DOCUMENTS

| | | | | |
|---|---|---|---|---|
| 5,200,962 A | * | 4/1993 | Kao et al. | 714/774 |
| 5,475,388 A | * | 12/1995 | Gormish et al. | 341/107 |
| 5,684,893 A | * | 11/1997 | Shikakura | 382/232 |
| 6,041,302 A | * | 3/2000 | Bruekers | 704/503 |
| 6,473,879 B1 | * | 10/2002 | Ishii et al. | 714/769 |
| 6,523,114 B1 | * | 2/2003 | Barton | 713/176 |
| 6,693,963 B1 | * | 2/2004 | Taniguchi | 375/240.11 |
| 6,980,498 B2 | * | 12/2005 | Sako | 369/47.24 |

* cited by examiner

*Primary Examiner*—M. Mujtaba K Chaudry
*Assistant Examiner*—Fritz Alphonse

(57) ABSTRACT

An apparatus and method for using an error correcting code to achieve data compression in a data communication network is disclosed. Data compression is achieved by performing an error correction encoding operation on input data. Data compression is further achieved by providing, for transmission across a communication channel, compressed data that is representative of the input data. The compressed data preferably includes error correction information produced by the error correction encoding operation. The compressed data requires less transmission channel capacity than does the input data.

20 Claims, 7 Drawing Sheets

BCH[7,4] CODE

BCH[7,4]
n = NUMBER OF CODE BITS = 7
k = NUMBER OF INFORMATION (DATA) BITS = 4
n - k = NUMBER OF PARITY BITS = 3
t = NUMBER OF CORRECTABLE BITS = 1
GENERATOR POLYNOMIAL = $13_8$ = 1011 = $x^3 + x + 1$

| NUMBER | BINARY DATA | PARITY BITS | PARITY | CODE WORD |
|---|---|---|---|---|
| 0 | 0000 | 000 | 0 | 0000000 |
| 1 | 0001 | 011 | 3 | 0001011 |
| 2 | 0010 | 110 | 6 | 0010110 |
| 3 | 0011 | 101 | 5 | 0011101 |
| 4 | 0100 | 111 | 7 | 0100111 |
| 5 | 0101 | 100 | 4 | 0101100 |
| 6 | 0110 | 001 | 1 | 0110001 |
| 7 | 0111 | 010 | 2 | 0111010 |
| 8 | 1000 | 101 | 5 | 1000101 |
| 9 | 1001 | 110 | 6 | 1001110 |
| 10 | 1010 | 011 | 3 | 1010011 |
| 11 | 1011 | 000 | 0 | 1011000 |
| 12 | 1100 | 010 | 2 | 1100010 |
| 13 | 1101 | 001 | 1 | 1101001 |
| 14 | 1110 | 100 | 4 | 1110100 |
| 15 | 1111 | 111 | 7 | 1111111 |

FIG. 2
(PRIOR ART)

BCH[7,4] CODE PARITY TO DATA
WORD MAPPING

| PARITY | BINARY DATA 1 | | BINARY DATA 2 | |
|---|---|---|---|---|
| | BINARY | DECIMAL | BINARY | DECIMAL |
| 0 | 0000 | 0 | 1011 | 11 |
| 1 | 0110 | 6 | 1101 | 13 |
| 2 | 0111 | 7 | 1100 | 12 |
| 3 | 0001 | 1 | 1010 | 10 |
| 4 | 0101 | 5 | 1110 | 14 |
| 5 | 0011 | 3 | 1000 | 8 |
| 6 | 0010 | 2 | 1001 | 9 |
| 7 | 0100 | 4 | 1111 | 15 |

FIG. 3

NUMBER OF SECTORS & BITS SAVED FOR SAMPLE BCH CODES

| CODE | NUMBER OF DATA BITS | NUMBER OF PARITY BITS | NUMBER OF SECTOR BITS | NUMBER OF VOICE SAMPLES & BITS QUANTIZED TO FULL WORD | | BITS SAVED |
|---|---|---|---|---|---|---|
| | | | | SAMPLES | BITS | |
| BCH[7,4] | 4 | 3 | 1 | 0.5 | 4 | 1 |
| BCH[15,11] | 11 | 4 | 7 | 1 | 8 | 4 |
| BCH[15,7] | 7 | 8 | 0 | 0.5 | 4 | -4 |
| BCH[15,5] | 5 | 10 | 0 | 1 | 8 | -2 |
| BCH[31,26] | 26 | 5 | 21 | 3 | 24 | 19 |
| BCH[31,21] | 21 | 10 | 11 | 2 | 16 | 6 |
| BCH[31,16] | 16 | 15 | 1 | 2 | 16 | 1 |
| BCH[31,11] | 11 | 20 | 0 | 1 | 8 | -12 |
| BCH[31,6] | 6 | 25 | 0 | 0.5 | 4 | -21 |
| BCH[63,57] | 57 | 6 | 51 | 7 | 56 | 50 |
| BCH[63,51] | 51 | 12 | 39 | 6 | 48 | 36 |
| BCH[63,45] | 45 | 18 | 27 | 5 | 40 | 22 |
| BCH[63,39] | 39 | 24 | 15 | 4 | 32 | 8 |
| BCH[63,36] | 36 | 27 | 9 | 4 | 32 | 5 |
| BCH[63,30] | 30 | 33 | 0 | 3 | 24 | -9 |
| BCH[63,24] | 24 | 39 | 0 | 3 | 24 | -15 |
| BCH[63,18] | 18 | 45 | 0 | 2 | 16 | -29 |
| BCH[63,16] | 16 | 47 | 0 | 2 | 16 | -31 |
| BCH[63,10] | 10 | 53 | 0 | 1 | 8 | -45 |
| BCH[63,7] | 7 | 56 | 0 | 0.5 | 4 | -52 |

FIG. 9

APPARATUS AND METHOD FOR USING AN ERROR CORRECTING CODE TO ACHIEVE DATA COMPRESSION IN A DATA COMMUNICATION NETWORK

TECHNICAL FIELD OF THE INVENTION

The present invention is directed generally to data communication systems and, more specifically, to the use of error correcting codes to perform data compression in such systems.

BACKGROUND OF THE INVENTION

Data compression is a useful tool for reducing the bandwidth required for communication of data on a transmission channel.

Some current compression schemes, such as Huffman compression, require knowledge about the frequency of expected data words, while others rely on compression of repeated data words, such as run length encoding, or require state information. Both lossless and lossy codes are available. Huffman compression and run length encoding are examples of lossless compression, and MP3 is an example of lossy compression.

Codes requiring knowledge of the frequency of expected data, such as Huffman codes, are useful for applications like the English language, where knowledge of the frequency of letter occurrence in English words can be used. Also, frequency information can be derived from the data to select the data encoding scheme. However, these codes may not work well for data with a more uniform distribution. Run length encoding is good if there are long periods of repeated data, such as zeros, but is of little use when noise causes the data to vary.

MP3 uses characteristics of the human ear to eliminate inaudible information, and thus is a lossy compression scheme. It uses Huffman encoding as a coding method, which in addition to serving as an encoding mechanism, allows additional compression in areas of relatively uniform sounds. If the application does not relate to the human ear, then MP3 is not applicable. Even for audio applications such as Voice Over IP (VoIP), the data is already severely limited at the high end of the frequency range, so the human ear effects are already addressed to some degree. Also, stereophonic effects are not applicable because VoIP is monaural.

Therefore, there is a need in the art for improved apparatuses and methods for compressing data in communication networks. In particular, there is a need for data compression with reduced dependence on factors such as, state information, knowledge of the data characteristics, characteristics of human users, and stereophonic effects.

SUMMARY OF THE INVENTION

Exemplary embodiments of the present invention achieve data compression by performing an error correction encoding operation on input data, and then providing compressed data including error correction information that corresponds to the input data and that has been produced by the error correction encoding operation.

To address the above-discussed deficiencies of the prior art, it is a primary object of the present invention to provide a data compression method and a related apparatus. According to an advantageous embodiment of the present invention, the method comprises the steps of: 1) receiving input data; and 2) providing compressed data that represents the input data but requires less transmission channel capacity than does the input data, including performing an error correction encoding operation on the input data, the compressed data including error correction information that corresponds to the input data and has been produced by the error correction encoding operation.

According to one embodiment of the present invention, the compressed data includes parity bits produced by the error correction encoding operation.

According to another embodiment of the present invention, the compressed data includes all parity bits produced by the error correction encoding operation.

According to still another embodiment of the present invention, the compressed data includes only parity bits produced by the error correction encoding operation.

According to a further embodiment of the present invention, the error correction encoding operation is a BCH encoding operation.

According to a still further embodiment of the present invention, the input data includes one of audio data and video data.

According to a yet further embodiment of the present invention, the transmission channel includes one of a wired channel, a wireless channel and a fiber optic channel.

It is a further object of the present invention to provide a data decompression apparatus and a related method. According to an advantageous embodiment of the present invention, the data compression apparatus comprises: 1) an input for receiving compressed data that represents a desired data word but requires less transmission channel capacity than does the desired data word, the compressed data including error correction information which corresponds to the desired data word and which has been produced by performing an error correction encoding operation on the desired data word; and 2) a determiner coupled to the input for determining the desired data word based on the compressed data.

According to one embodiment of the present invention, the determiner includes a look-up table having stored therein a plurality of possible data words which each correspond to the compressed data.

According to another embodiment of the present invention, the determiner is for selecting one of the possible data words that is closest to a prediction of the desired data word.

According to still another embodiment of the present invention, the determiner is for selecting one of the possible data words that is within a predetermined range of a prediction of the desired data word.

According to yet another embodiment of the present invention, the determiner is for taking a prediction of the desired data word to be the desired data word if none of the possible data words is within a predetermined range of the prediction.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 2 illustrates in tabular format the characteristics of a conventional error correction code;

FIG. 3 illustrates in tabular format a parity-to-data word mapping characteristic of the code of FIG. 2 that can be utilized for data compression according to exemplary embodiments of the invention;

FIG. 9 illustrates in tabular format selected data compression performance characteristics associated with the various error correction codes.

DETAILED DESCRIPTION OF THE INVENTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data communication system.

Figure 1:
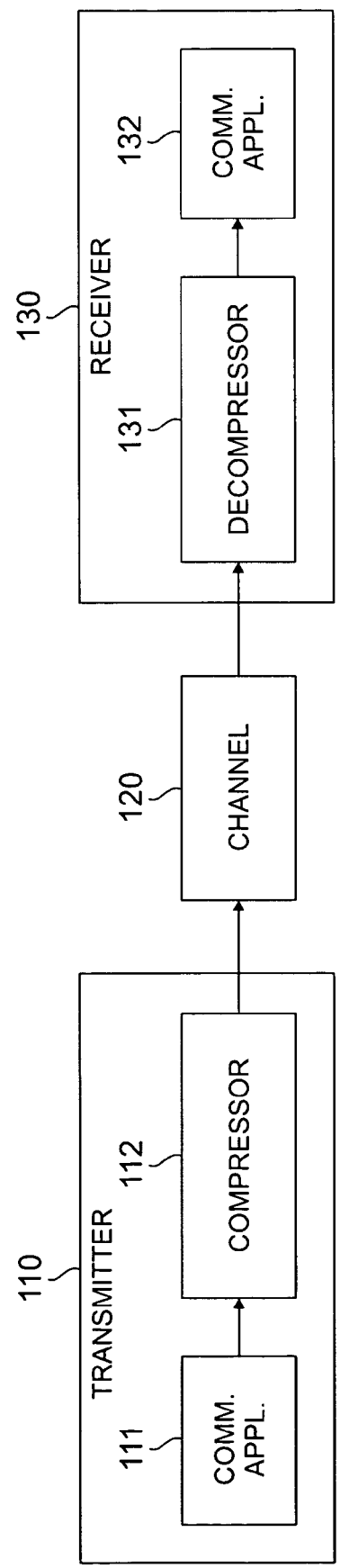
FIG. 1 illustrates a prior art communication system that utilizes data compression.

FIG. 1 illustrates a conventional example of a data communication system including data compression. At the transmitter 110, data provided by a communication application 111 is compressed by a compressor 112, and the resulting compressed data is transmitted to a receiver 130 via a communication channel 120. At the receiver, a decompressor 131 receives the compressed data and attempts to reconstruct therefrom the original data as provided by the communication application 111. The reconstructed data is then provided to a communication application 132.

The present invention recognizes that error correcting codes can be used for data compression.

FIG. 2 illustrates a conventional example of an error correcting code, namely a Bose, Chaudhuri, and Hocquenghem (BCH) code. The example of FIG. 2 is commonly referred to as a BCH [7,4] code. It is a BCH code whose code words include 7 total bits, 4 of which are data bits and 3 of which are redundant parity bits. The code word is transmitted over a communication channel to a receiver, and the combination of the data bits and the parity bits of the code word facilitate the receiver's ability to correct errors that may have occurred in the data bits during transmission of the code word. Also as shown in FIG. 2, a BCH code can be generally represented by BCH [n, k], where a code word includes n bits, k of which are data bits, and n−k of which are parity bits. The parity bits of a given code word are determined from the remainder produced when $x^{n-k}$ times the data bits of that code word are divided by a generator polynomial associated with the BCH code, for example, $x^3+x+1$ (1011) for a BCH [7,4] code.

Continuing with the exemplary BCH [7,4] code, if only the parity bits of a given code word are transmitted, then 3 bits are transmitted instead of the 4 data bits, thus achieving data compression. Due to the compression, there is not a one-to-one correspondence between the parity value and the data value in FIG. 2. Rather, each parity value is associated with two different binary data values, as illustrated in FIG. 3. Thus, for example, if a parity value of 3 (011) is received at the receiver, then the decompressor at the receiver needs to determine whether the original binary data value was 1(0001) or 10 (1010). Thus, in the BCH [7,4] code, each parity value is repeated twice in the code space and, if the parity value alone is received, then the corresponding data could be one of two different values. This effectively divides the data into two sectors, and the receiver needs to determine which of these sectors holds the desired data value.

More generally, a BCH [C,D] code has $2^D$ data words (i.e., sets of data bits), $2^{C-D}$ parity words (i.e., sets of parity bits) and $2^{2D-C}$ sectors (i.e., repetitions of the data words). So the BCH code has $2^4$=16 data words, $2^3$=8 parity words and $2^1$=2 sectors. Similarly, a BCH [15,11] code has $2^{11}$=2048 data words, $2^4$=16 parity words, and $2^7$=128 sectors. Thus, for the BCH [15,11] code, each parity word corresponds to 128 data words, one in each sector. Therefore, the receiver would need to determine which of the 128 sectors contains the desired data word.

Figure 4:
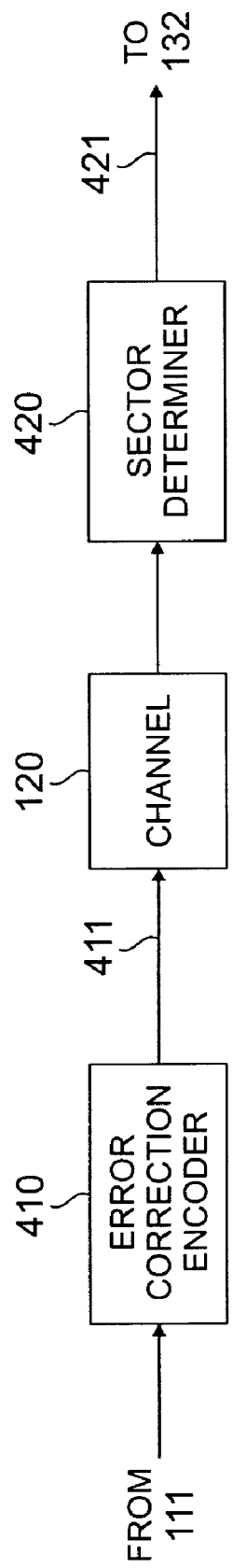
FIG. 4 illustrates exemplary embodiments of a communication system that utilizes data compression according to the invention.

FIG. 4 illustrates exemplary embodiments of a data communication system according to the invention. In the example of FIG. 4, an error correction encoder 410 at the transmitter functions as a data compressor which receives input data from the communication application 111 (see also FIG. 1), and produces compressed data which represents the input data. In the example of FIG. 4, the error correction encoder performs an error correction encoding operation on the input data word. The parity bits resulting from this error correction encoding operation are then provided at 411 as compressed data which is representative of the input data word and which is to be transmitted across the communication channel 120. At the receiver, a sector determiner 420 receives the parity bits and attempts to determine the sector in which the desired data word resides. The sector determiner 420 thus performs the decompression function of reconstructing the desired data word from the compressed data received from the channel 120. The desired data word is then provided at 421 for use by the communication application 132 (see also FIG. 1).

In the exemplary data communication system of FIG. 4, either or both of the transmitter and receiver can be, for example, a fixed-site apparatus (such as a computer or a cellular base station), a portable apparatus (such as an apparatus mounted in a land, sea or airborne vehicle), or a mobile apparatus (for example a laptop computer or a cellular telephone). The communication channel 120 can be, for example, a wired channel, a wireless channel, a fiber optic channel, or any combination thereof. The transmitted data can be, for example, audio data such as voice data or VoIP, video data, or data associated with any application where occasional errors can be tolerated or filtered out. The error detection encoder 410 can be, for example, a BCH encoder, or an encoder that implements any other type of error correcting code that produces redundant parity bits for error correction purposes.

Figure 5:
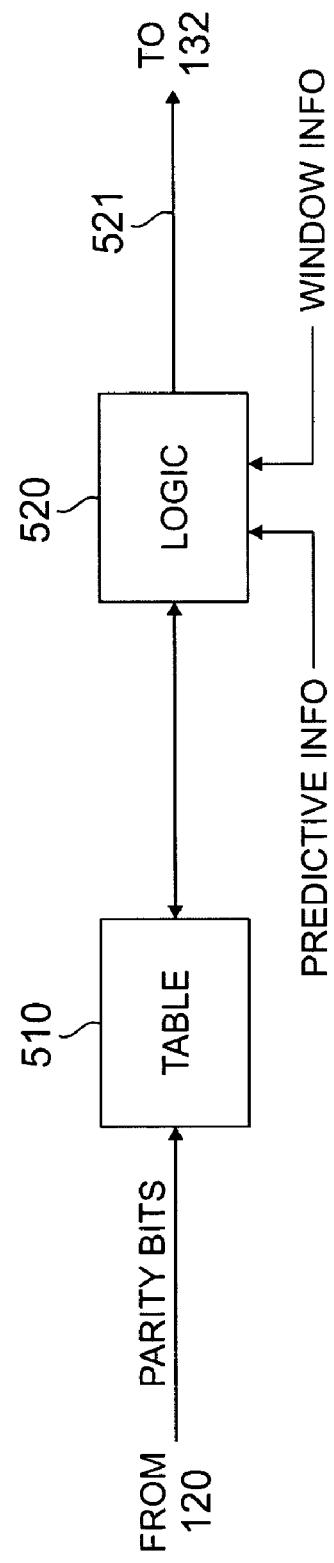
FIG. 5 illustrates exemplary embodiments of the sector determiner of FIG. 4.

FIG. 5 illustrates exemplary embodiments of the sector determiner 420 of FIG. 4. In the example of FIG. 5, the parity bits received from the channel 120 are used to identify in a look-up table 510 the data words which correspond to the particular set of parity bits that has been received. Each corresponding data word comes from a different sector, so the number of possible data words depends on the number of sectors associated with the error correction code that was used to produce the parity bits. As mentioned above, there are two sectors for a BCH [7,4] code, and there are 128 sectors for a BCH [15,11] code. Logic 520 coupled to look-up table 510 attempts to determine the desired sector, and thus the desired data word. The desired data word is then output at 521 for use by the communication application 132.

In some exemplary embodiments, the logic 520 determines the desired sector based on predictive information that is provided to the logic 520. In some exemplary embodiments, this predictive information may be obtained by tracking previously selected sectors over time. In other exemplary embodiments, the logic 520 selects the desired data word based on predictive information that tracks previously selected data words over time. In other exemplary embodiments, the logic 520 selects the desired data word based on a predicted data word produced by a filtering operation. In some exemplary embodiments the logic 520 selects the desired data word based on predictive information about the data communication that is known a priori. In some embodiments, the logic 520 selects the desired data word by combining the predictive information with window information that defines a predetermined range of acceptable data values relative to the predictive information. For example, if the predictive information predicts the value of the desired data word, and if the window information specifies a predetermined range of values relative to (e.g., surrounding) the predicted value, then logic 520 can select the value from table 510 that falls within the window range. If more than one value from table 510 falls within the window range, the logic 520 can, for example, select the value that is closest to the predicted value.

Figure 6:
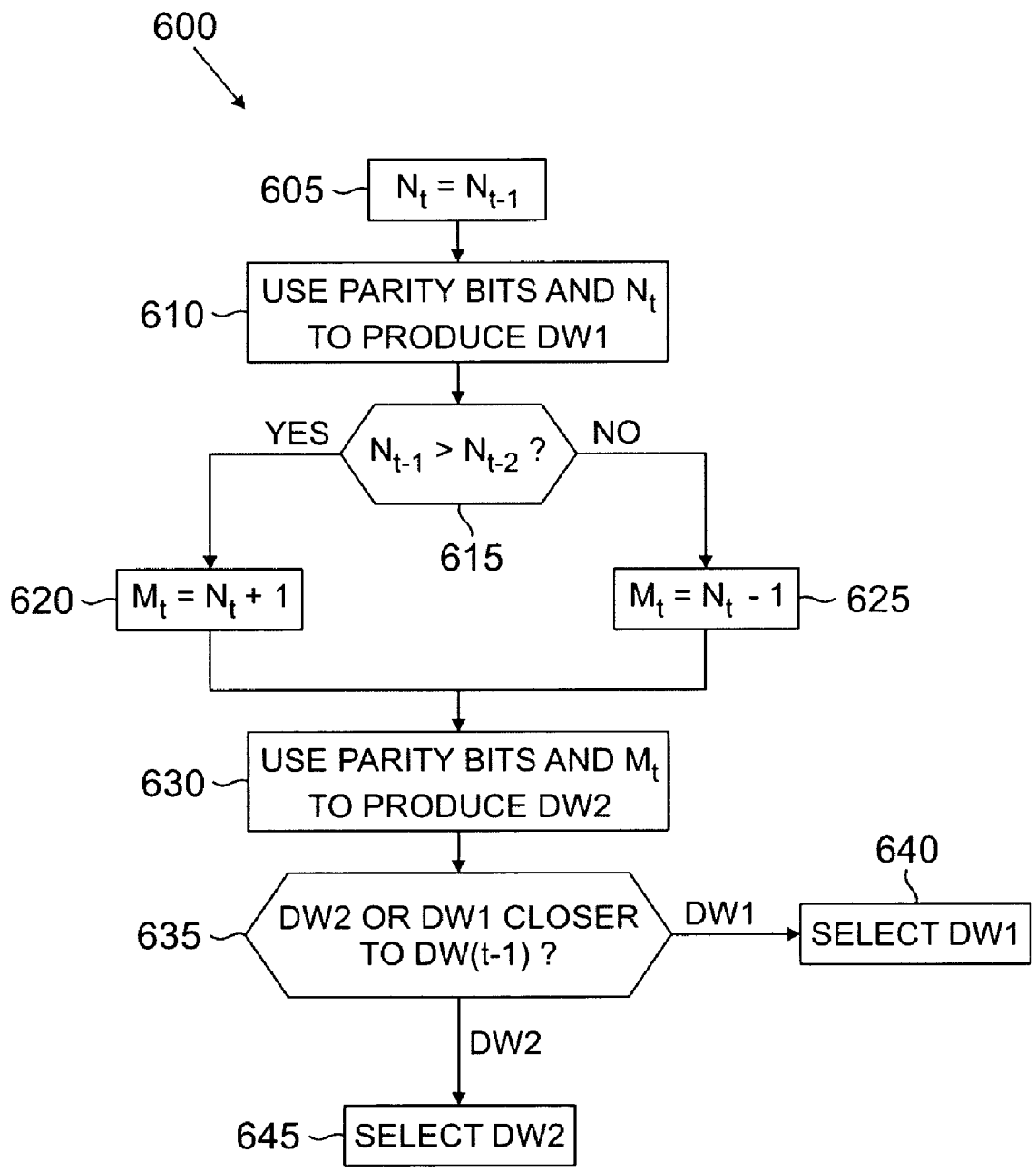
FIG. 6 illustrates exemplary sector determination operations according to the invention.

FIG. 6 illustrates exemplary sector selection operations according to the invention, utilizing predictive information based on tracking of previously selected sectors. At 605, the current sector value $N_t$ is set equal to the immediately preceding sector value ($N_{t-1}$) that was selected in decompressing the immediately preceding set of received parity bits. At 610, the currently received parity bits are used together with $N_t$ to produce a first data word, DW1. It is then determined at 615 whether $N_{t-1}$ is greater than $N_{t-2}$, where $N_{t-2}$ is the sector value that was selected in decompressing the second-most recently received set of parity bits. If $N_{t-1}$ is greater than $N_{t-2}$ at 615, then $M_t$ is set to $N_t+1$ at 620. Otherwise $M_t$ is set to $N_t-1$ at 625. After $M_t$ is set at 620 or 625, it is used at 630 together with the currently received parity bits to produce a second data word DW2. Thus, if the sector value is trending upwardly at 615, then the sector value $M_t$ used to produce DW2 is larger by one than the sector value $N_t$ that was used to produce DW1. Conversely, $M_t$ is less than $N_t$ by one if the sector value is not trending upwardly at 615. Once DW1 and DW2 have been determined at 610 and 630, respectively, it is determined at 635 which of these two data words is closer to the data word DW(t-1) that was ultimately selected during decompression of the immediately preceding set of parity bits. If DW1 is closer, then DW1 is selected as the desired data word at 640. If DW2 is closer, then DW2 is selected as the desired data word at 645.

The logic 520 of FIG. 5 can perform the exemplary operations of FIG. 6, using $N_t$ together with the currently received parity bits to address the look-up table 510 and thereby obtain DW1, and using $M_t$ together with the currently received parity bits to address the look-up table 510 and thereby obtain DW2.

Figure 7:
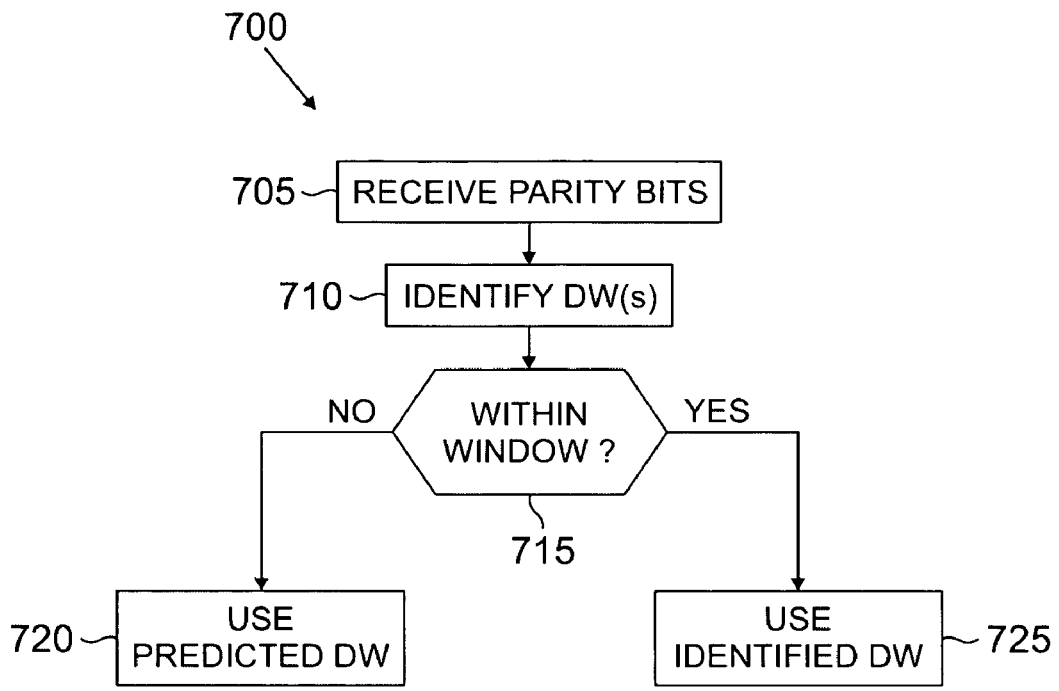
FIG. 7 illustrates further exemplary sector determination operations according to the invention.

FIG. 7 illustrates exemplary operations for selecting a desired data word in response to received parity bits according to the invention. After receiving the parity bits at 705, one or more possible data words can be identified at 710. If a single data word has been identified (e.g., randomly selected from the set of possible data words) at 710, and is within a predetermined window relative to a predicted data word at 715, then the identified data word is used at 725. Otherwise, the predicted data word is used at 720. If a plurality of possible data words are identified at 710, and if more than one of the identified data words are within the window at 715, then the identified data word that is closest to the predicted data word is used at 725. If only one of the plurality of possible data words identified at 710 is within the window at 715, then that data word is used at 725. If none of the plurality of possible data words identified at 710 is within the window at 715, then the predicted data word is used at 720.

Figure 8:
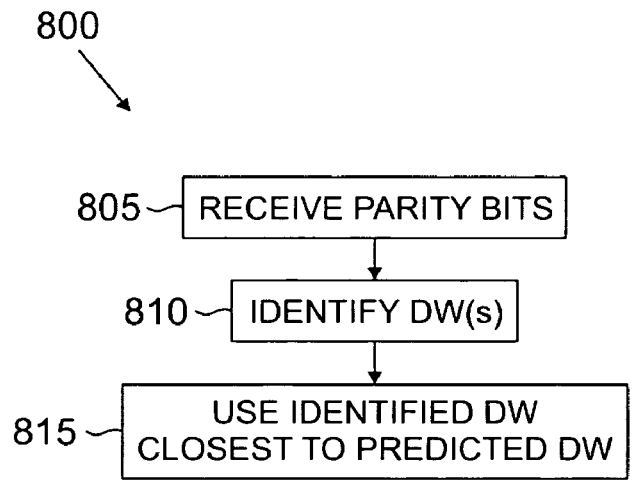
FIG. 8 illustrates further exemplary sector determination operations according to the invention.

FIG. 8 illustrates further exemplary operations for selecting a desired data word in response to received parity bits according to the invention. The operations of FIG. 8 are similar to those of FIG. 7, but the windowing operation of FIG. 7 is not utilized in FIG. 8. After the parity bits are received at 805, a plurality of possible data words is identified at 810. The identified data word that is closest to the predicted data word is then selected as the desired data word at 815.

As mentioned above, some exemplary embodiments utilize a filtering operation to produce predicted information for use in selecting the desired data word in response to received parity bits. An example of a conventional alpha-beta filter which can be used for this purpose is as follows:

$$d_{p,i+1} = d_{s,i} + v_i$$

and smoothing given by $$d_{s,i+1} = d_{p,i+1} + \alpha[d_{new} - d_{p,i+1}]$$

$$v_{i+1} = v_i + \beta[d_{new} - d_{p,i+1}]$$

where $d_{p,i+1}$ is the predicted data value for sample i+1, $d_{s,i+1}$ is the smoothed data value for sample i+1, $d_{new}$ is the new data value, $v_{i+1}$ and $v_i$ are the data rate of change values at samples i+1 and i respectively, and α and β are the filter constants. This collapses to a simple one pole filter of the form $d_i = d_{i-1} + \alpha[d_{new} - d_{i-1}]$ when β is zero.

In some exemplary embodiments, a BCH [7,4] code is used together with predictive information produced by an alpha-beta filter with alpha=0.9 and beta=0 and no windowing. In other exemplary embodiments, a BCH [15,11] code is used with predictive information provided by an alpha-beta filter having alpha=0.9 and beta=0 and no windowing.

Other exemplary embodiments utilize a BCH [7,4] code and predictive information provided by an alpha-beta filter where alpha=0.6 and beta=0.25, and with windowing according to any of the following parameters:

no windowing;
a window width of 4;
a window width of 7.5;
a window width of 8.5; or
a window width of 9.

Other exemplary embodiments use a BCH [15,11] code and predictive information provided by an alpha-beta filter having alpha=0.6 and beta=0.25, together with windowing according to either of the following parameters:

a window width of 200; or a window width of 1000.

In some exemplary embodiments, the predictive information is produced by a filter having a cut-off frequency chosen to match the input data function.

FIG. 9 illustrates in tabular format selected characteristics of various error correction codes. Those codes with a negative value in the "bits saved" column do not achieve data compression. The "samples" and "bits" columns indicate how the various codes can be applied to an exemplary communication session involving data with an 8-bit sample size. For example, the BCH [31, 26] code fits the data fairly well because it accommodates three 8-bit data samples with two bits left over. The amount of compression provided by BCH [31, 26] is relatively high, as indicated by the large number of sectors ($2^{21}$), but this does lead to a large degree of uncertainty about the actual data value.

It will be evident to workers in the art that the embodiments of FIGS. 3-9 can be readily implemented, for example, by suitably modifying software, hardware, or a combination of software and hardware in conventional data communication transmitters and receivers.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of data compression comprising:

receiving input data to be transmitted to a receiving device;

performing an error correction encoding operation on the input data to thereby generate error correction coding data, wherein the error correcting code data relates to least two data values; and transmitting the error correction coding data to the receiving device in place of the input data, wherein the error correction coding data requires less transmission channel capacity than the input data, wherein a receiver determines which of the data values is intended.

2. The method as set forth in claim 1, wherein the error correction coding data includes parity bits produced by the error correction encoding operation.

3. The method as set forth in claim 2, wherein the error correction coding data includes all parity bits produced by the error correction encoding operation.

4. The method as set forth in claim 3, wherein the error correction coding data includes only parity bits produced by the error correction encoding operation.

5. The method as set forth in claim 2, wherein the error correction coding data includes only parity bits produced by the error correction encoding operation.

6. The method as set forth in claim 2, wherein the input data includes audio data.

7. The method as set forth in claim 1, wherein the error correction encoding operation is a Bose-Chaudhuri-Hocquenghern (BCH) encoding operation.

8. The method as set forth in claim 1, wherein the input data includes one of audio data and video data.

9. A data compression apparatus comprising:

an input for receiving input data to be transmitted to a receiving device;

an error correction encoder coupled to receive the input data for performing an error correction encoding operation on the input data to thereby generate error correction coding data, wherein the error correction coding data requires less transmission channel capacity than the input data, wherein the error correcting code data relates to at least two data values; and an output for providing the error correction coding data to a transmitter for subsequent transmission of tile error correction coding data to the receiving device in place of the input data wherein a receiver determines which of the at least two data values is intended.

10. The data compression apparatus as set forth in claim 9, wherein the error correction coding data includes parity bits produced by the error correction encoding operation.

11. The data compression apparatus as set forth in claim 10, wherein the error correction coding data includes all parity bits produced by the error correction encoding operation.

12. The data compression apparatus as set forth in claim 11, wherein the error correction coding data includes only parity bits produced by the error correction encoding operation.

13. The data compression apparatus as set forth in claim 10, wherein the error correction coding data includes only parity bits produced by the error correction encoding operation.

14. The data compression apparatus as set forth in claim 10, wherein the error correction encoding operation is a Bose-Chaudhuri-Hocquenghern (BCH) encoding operation.

15. The data compression apparatus as set forth in claim 10, wherein the input data includes audio data.

16. The data compression apparatus as set forth in claim 10, wherein the transmission channel includes one of a wired channel, a wireless channel and a fiber optic channel.

17. The data compression apparatus as set forth in claim 10, wherein the input data includes video data.

18. The data compression apparatus as set forth in claim 9, wherein the error correction encoding operation is a Bose-Chaudhuri-Hocquenghem (BCH) encoding operation.

19. The data compression apparatus as set forth in claim 9, wherein the input data includes one of audio data and video data.

20. The data compression apparatus as set forth in claim 9, wherein the transmission channel includes one of a wired channel, a wireless channel and a fiber optic channel.

* * * * *